United States Patent [19]

Lee et al.

[11] Patent Number: 4,973,378

[45] Date of Patent: Nov. 27, 1990

[54] METHOD OF MAKING ELECTRONIC DEVICES

[75] Inventors: Rosemary A. Lee, Northwood; William M. Lovell, Fareham, both of England

[73] Assignee: The General Electric Company, p.l.c., England

[21] Appl. No.: 485,445

[22] Filed: Feb. 27, 1990

[30] Foreign Application Priority Data

Mar. 1, 1989 [GB] United Kingdom ................ 8904648

[51] Int. Cl.[5] ...................... H01L 21/306; B44C 1/22; C23F 1/02; C03C 15/00

[52] U.S. Cl. .................................... 156/633; 156/634; 156/643; 156/651; 156/656; 156/657; 156/659.1

[58] Field of Search ............... 156/629, 630, 633, 634, 156/643, 646, 651, 653, 656, 657, 659.1, 662; 430/312, 313, 317, 318; 313/309, 336, 351, 355; 427/077; 428/156, 167

[56] References Cited

U.S. PATENT DOCUMENTS

| | | | |
|---|---|---|---|
| 3,878,423 | 4/1975 | Hill et al. | 313/267 |
| 3,921,022 | 11/1975 | Levine | 313/309 |
| 3,998,678 | 12/1976 | Fukase | 156/651 |
| 4,585,991 | 4/1986 | Reid et al. | 156/647 X |
| 4,685,996 | 8/1987 | Busta et al. | 156/651 X |
| 4,908,539 | 3/1990 | Meyer | 315/169.3 |

*Primary Examiner*—William A. Powell

*Attorney, Agent, or Firm*—Kirschstein, Ottinger, Israel & Schiffmiller

[57] ABSTRACT

A field emission device which may be used, for example, as a surge arrester, comprises two electrode structures each comprising a substrate from which project tapered electrically-conductive emitter bodies. The structures are bonded together, face-to-face, so that the emitters all project into a sealed space formed between the substrates. The space may be evacuated or gas-filled. The emitters are formed by depositing a conductive layer on each substrate, forming masking pads on the layer at the required emitter positions, and etching the conductive layer to leave a tapered body beneath each pad. The dimensions of the emitter bodies and the spacing between the substrates are preferably of the order of a few microns.

19 Claims, 3 Drawing Sheets

FIG. 4(a)
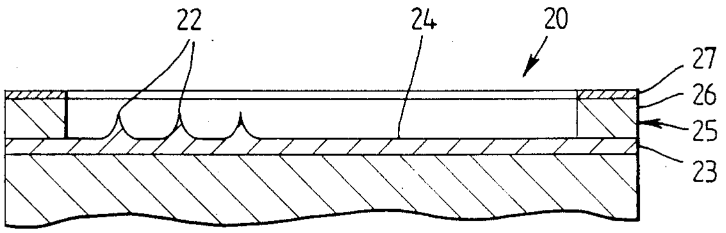
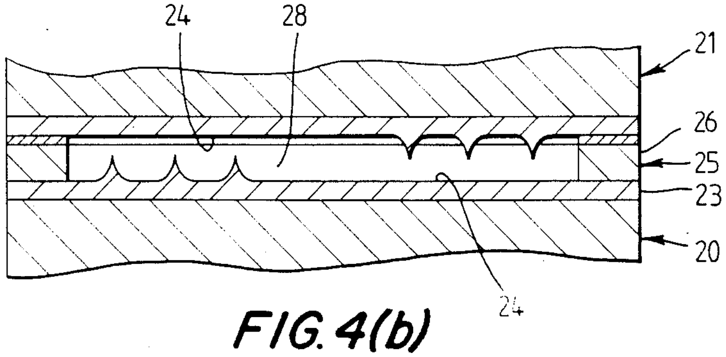
FIG. 4(b)

METHOD OF MAKING ELECTRONIC DEVICES

This invention relates to a method of making electronic devices and to such devices per se. The devices may be, more particularly, field emission devices.

During recent years there has been considerable interest in the construction of field emission devices having cathode dimensions and anode/cathode spacings of the order of only a few microns. In the manufacture of some such devices, arrays of pyramid-shaped cathodes have been formed by etching away unwanted regions of a crystal or metal layer, leaving behind the required pyramid shapes. A planar metal anode layer has then been formed, spaced from and insulated from the cathodes. This anode layer may be continuous, or may be divided into smaller areas to form individual anodes or groups of anodes.

It is an object of the present invention to provide a new method of forming a field emission device. It is a further object of the invention to provide a new field emission device structure.

According to one aspect of the invention there is provided a method of forming an electron emission device, the method comprising providing a first electrode structure comprising a first substrate with at least one tapered electrically-conductive body projecting therefrom; providing a second electrode structure comprising a second substrate with at least one tapered electrically-conductive body projecting therefrom; inverting said second electrode structure relative to said first electrode structure; and bonding the two electrode structures together with a space defined between the substrates and with the or each tapered body of each structure projecting into the space.

According to another aspect of the invention there is provided a field emission device comprising two electrode structures, one inverted relative to the other, each having at least one tapered electrically-conductive body projecting therefrom, the structures being bonded together with a space defined therebetween and with the or each tapered body of each structure projecting into the space.

The ends of the tapered bodies of the two structures may be so positioned that the or each body end of the second structure is substantially axially aligned with a respective body end of the first structure. Alternatively, the or each body end of each structure may point towards a portion of the substrate of the other structure.

Figure 1A:
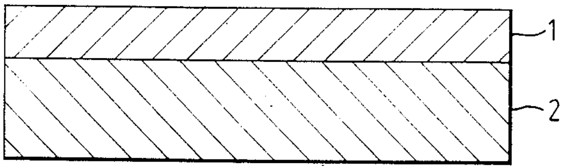
Figure 1B:
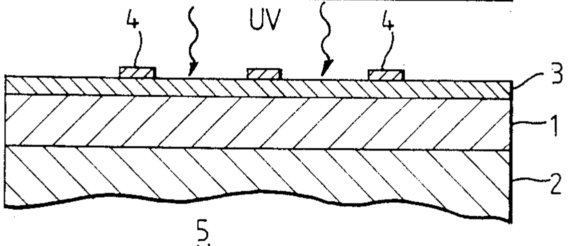
Figure 1C:
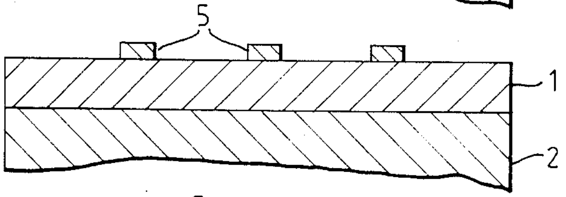
Figure 1D:
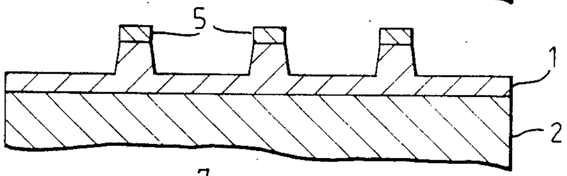
Figure 1E:
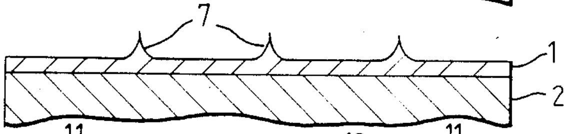
Figure 1F:
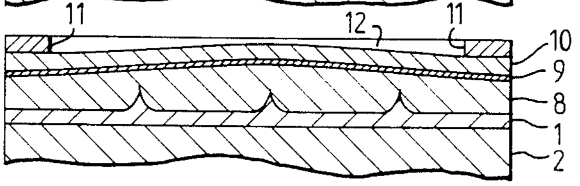
Figure 1G:
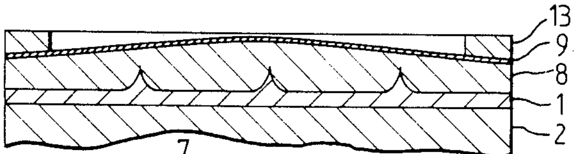
Figure 1H:
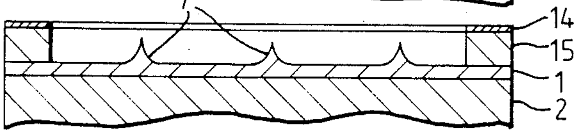
Figure 2:
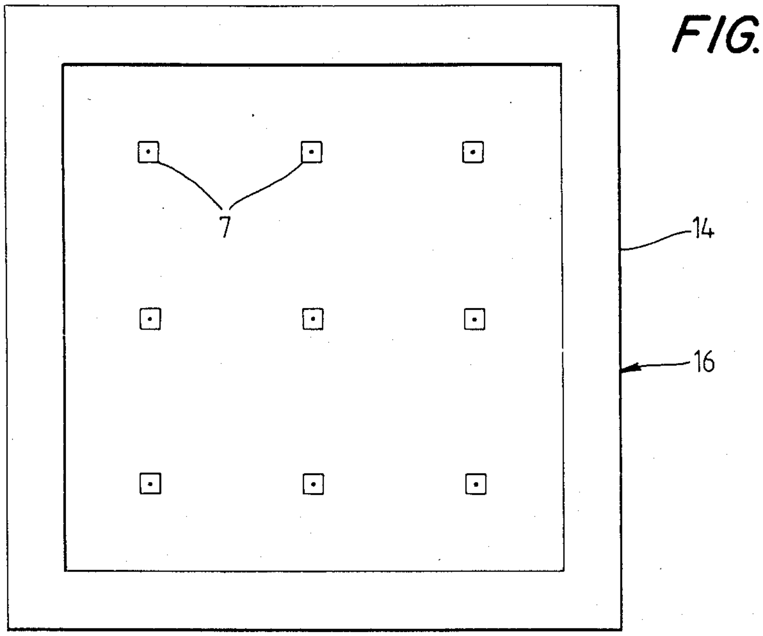

Embodiments of the invention will now be described, by way of example, with reference to the accompanying drawings, in which FIGS. 1(*a*)–1(*h*) illustrate, schematically, stages in a first part of a method in accordance with the invention for forming a first field emission device, FIG. 2 is a schematic plan view of an electrode structure formed by the method of FIG. 1, FIGS. 3(*a*) and 3(*b*) illustrate, schematically, stages in a second part of the method, and FIGS. 4(*a*) and 4(*b*) illustrate, schematically, the later stages in a method in accordance with invention for forming a second field emission device.

Referring to FIG. 1(*a*), a layer 1 of niobium of say, 2 μm thickness is sputtered on to a highly-doped n-type silicon substrate 2. A layer 3 of resist (FIG. 1(*b*)) is deposited on the layer 1, and the resist is exposed to UV through a mask 4. The resist layer is developed, and unwanted parts removed, thereby forming etching mask pads 5.

The niobium layer 1 is then subjected to reactive ion etching using $SF_6/Cl_2/O_2$, and columns 6 are left beneath the pads 5. (FIG. 1(*d*)).

The pads 5 are then removed from the tops of the columns, and the device is exposed to further reactive ion etching using $SF_6/N_2$, which etches the columns into very sharply-pointed tapering electrode tips 7. (FIG. 2(*e*)).

The electrode tips may be up to 10 μm apart (preferably about 1 μm), and may be up to 10 μm high.

A dielectric layer 8 of doped silicon dioxide of, say, 3 μm thickness is then deposited over the etched layer 1, and a metal layer 9 of, say, 1000 Å thickness is deposited over the layer 8. The layer 9 may be formed of, for example, aluminium. A resist layer 10 is deposited over the metallisation 9. A rectangular mask 11 having a central rectangular aperture 12 therethrough is positioned over the resist layer 10 (FIG. 1(*f*)). The resist layer 10 is exposed to UV through the mask 11, and the unwanted central area of the resist layer is then etched away, leaving a rectangular frame 13 (FIG. 1(*g*)) of resist material around the periphery of the structure.

The resist frame 13 is then used as a mask during etching of the unwanted central portion of the metal layer 9 and of the dielectric layer 8. A rectangular frame portion 14 of the metal layer 9, supported by a corresponding frame portion 15 of the dielectric material, is therefore retained round the periphery of the structure. The frame 13 of resist material is then removed by etching. The combined height of the frame portions 14 and 15 may be, say, 2 μm higher than the electrode tips 7.

A plan view of the resulting electrode structure 16 is shown schematically in FIG. 2 of the drawings. Although an array comprising nine electrode tips 7 is shown, there may by any other desired number of tips in the structure 16.

Figure 3A:
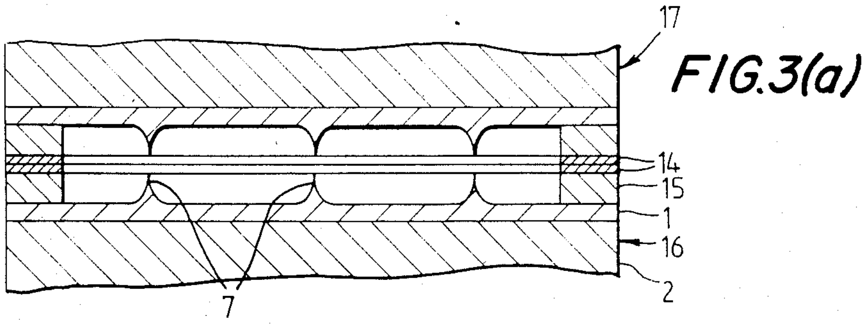
Figure 3B:
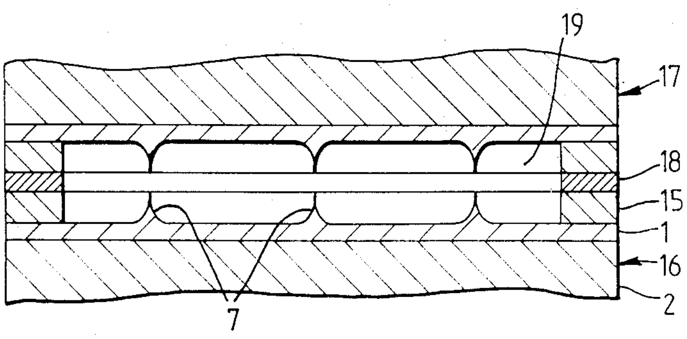

Referring to FIG. 3(*a*), in the next stage in the production of the field emission device a second electrode structure 17, which is identical to the structure 16, is inverted over the structure 16, with the metal frame portions 14 of the two structures in contact.

The device is then heated until the metal frame portions melt and merge into a single layer 18, bonding the two structures 16 and 17 together and sealing the space 19 containing the electrode tips 7. (FIG. 3(*b*)). During this bonding operation the device may be mounted in a vacuum enclosure, so that the resulting sealed space 18 is evacuated. Alternatively, the operation may be carried out in a gaseous environment, so that the space 19 is gas-filled at a desired low gas pressure.

The electrode tips of the two structures may be aligned, as shown in FIG. 3(*b*), or the tip positions may be such that when the two structures are brought together the tips of each structure point towards the gaps between the tips of the other structure. The gaps between the tips of one structure and the tips of the other structure may be up to 10 μm, but are preferably about 1 μm.

An alternative field emission device construction is shown in FIG. 4 of the drawings. Two electrode structures 20 and 21 are formed by a similar process to that described above, but in this case electrode tips 22 are located towards one side of the niobium layer 23, so that each structure has a substantially planar region 24 of the layer extending between the group of tips and the frame 25 formed by dielectric and metal frame layers 26,27.

The structure 21 is inverted over the structure 20, with the structure 21 rotated through 180° relative to the structure 20, so that the tips 22 of each structure point towards the planar region 24 of the other structure. The structures are then bonded together to form an evacuated or gas-filled sealed space therebetween, as before. In this case, however, the niobium layers of the two devices are closer together than in the embodiment described above, because the gap between the tips 22 of one structure and the planar region 24 of the other structure will be comparable to the gap between the tips 7 of the two structures in the first embodiment. For that reason it is preferable, in the second embodiment, to provide the frame 25 on only one of the structures, and to bond the metal frame layer 27 of that structure directly to the niobium layer of the other structure, as shown in FIG. 4(*b*).

In each of the above embodiments a number of modifications can be made. Although the electrode tips are formed from a niobium layer in those embodiments, they could alternatively be formed from a layer of another metal such as silicon, rhodium, molybdenum, gold nickel or tungsten, a metal compound or a semiconductor material. The etching of the layer to form the tips could be effected by any suitable wet or dry etching processes such as plasma etching, reactive ion etching, ion beam milling, or reactive ion beam milling. The substrate in each case could alternatively be formed of another semiconductor material or a single-crystal metal. The dielectric layers could be formed of another material, such as silicon nitride, and the metallisation layers could be formed of any suitable metal.

In each of the field emission devices described above, electrical connection will be made to each set of tips via the respective substrate, so that a potential difference can be applied between the two structures, biasing one structure negatively relative to the other structure. If the potential difference is sufficiently large, field emission will take place from the tips of the negatively-biased structure to the tips, or to the planar region, of the other structure, as the case may be. Current will therefore flow between the two structures. Since each electrode structure of each described device has electrode tips (i.e. the device is symmetrical), reversal of the bias will cause current to flow in the opposite direction through the device.

The devices may be used as surge arresters for protecting, for example, delicate electronic equipment. Such a device is connected across the equipment which is to be protected, and operates by becoming conductive on receipt of a voltage surge, thereby short-circuiting the surge which might otherwise damage the equipment.

It is essential that such devices shall turn on rapidly, before the surge causes any damage. Conventional surge arresters are relatively slow in operation, because they rely on the initiation of a discharge in an ionised gas.

The present vacuum devices have very close electrode spacings and rely on the passage of electrons through a vacuum, in which the electron flow is not impeded. A very high operating speed can therefore be achieved.

As stated above, the sealed space between the electrode structures may be evacuated or may be gas-filled. In the latter case, the field emission from the electrode tips will cause ionisation of the gas, giving rise to the current flow through the device.

As compared with semiconductor devices, the devices of the present invention operate more quickly and are more able to survive in hostile environments.

We claim:

1. A method of forming an electron emission device, the method comprising providing a first electrode structure comprising a first substrate with at least one tapered electrically-conductive body projecting therefrom; providing a second electrode structure comprising a second substrate with at least one tapered electrically-conductive body projecting therefrom; inverting said second electrode structure relative to said first electrode structure; and bonding the two electrode structures together with a space defined between the substrates and with the or each tapered body of each structure projecting into the space.

2. A method as claimed in claim 1, wherein each said electrically-conductive body is formed from a layer of electrically-conductive material provided on the respective substrate.

3. A method as claimed in claim 2, wherein each said electrically-conductive body is formed from said layer of electrically-conductive material by depositing a masking pad on said layer in the required position for the or each electrically-conductive body; and etching the layer to form said tapered body beneath the pad.

4. A method as claimed in claim 3, wherein the etching of the layer to form the or each electrically-conductive body is effected by a wet etching process.

5. A method as claimed in claim 3, wherein the etching of the layer to form the or each electrically-conductive body is effected by a dry etching process.

6. A method as claimed in claim 3, wherein the etching of the layer to form the or each electrically-conductive body is effected by a wet etching process followed by a dry etching process.

7. A method as claimed in claim 5, wherein the dry etching is effected by plasma etching, reactive ion etching, ion beam milling, or reactive ion beam milling.

8. A method as claimed in claim 7, wherein the dry etching is effected by a plasma etching process carried out in $SF_6/Cl_2/O_2$.

9. A method as claimed in claim 7, wherein the dry etching is effected by a reactive ion etching process carried out in $SF_6/N_2$.

10. A method as claimed in claim 2, wherein the layer is formed of a semiconductor, a metal or a metal compound.

11. A method as claimed in claim 10, wherein the layer is formed of niobium, silicon, rhodium, molybdenum, gold, nickel or tungsten.

12. A method as claimed in claim 11, wherein the layer is formed of single crystal nickel, tungsten or rhodium.

13. A method as claimed in claim 1, further comprising the step of forming a frame of dielectric material round the periphery of at least one of the electrode structures to act as a spacer between the electrode structures.

14. A method as claimed in claim 13, wherein the or each frame of dielectric material has a metal layer thereon for use in the bonding step.

15. A method as claimed in claim 14, wherein the metal layer of the or each frame is formed of aluminium.

16. A method as claimed in claim 1, wherein the or each tapered body of the first electrode structure is substantially axially aligned with a respective tapered body of the second electrode structure.

17. A method as claimed in claim 1, wherein the or each tapered body of each electrode structure points towards a substantially planar region of the other electrode structure.

18. A method as claimed in claim 1, wherein said space defined between the substrates is evacuated.

19. A method as claimed in claim 1, wherein said space defined between the substrates is gas-filled.

* * * * *